US012648233B2

(12) United States Patent
Lin

(10) Patent No.: US 12,648,233 B2
(45) Date of Patent: Jun. 2, 2026

(54) ELECTRONIC DEVICE WITH ELECTROSTATIC PROTECTION CIRCUITS CONNECTED TO DIODE AND DRIVING CIRCUITS

(71) Applicant: InnoLux Corporation, Miao-Li County (TW)

(72) Inventor: Chun-Hsien Lin, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 669 days.

(21) Appl. No.: 18/084,478

(22) Filed: Dec. 19, 2022

(65) Prior Publication Data

US 2023/0238379 A1     Jul. 27, 2023

(30) Foreign Application Priority Data

Jan. 24, 2022     (CN) ......................... 202210081378.3

(51) Int. Cl.
*H10D 89/60*          (2025.01)
(52) U.S. Cl.
CPC ......... *H10D 89/814* (2025.01); *H10D 89/811* (2025.01); *H10D 89/931* (2025.01)
(58) Field of Classification Search
CPC .......... H10D 86/441–443; H10D 89/811–819;

H10K 59/123; H10K 59/131; H10H 20/064; H10H 20/857; H10H 28/49; H10F 77/93; H10F 19/902–908

See application file for complete search history.

(56) References Cited

U.S. PATENT DOCUMENTS

| | | | | |
|---|---|---|---|---|
| 2017/0372677 A1* | 12/2017 | Chang | .................. | G09G 3/3233 |
| 2023/0066908 A1* | 3/2023 | Tseng | .................... | H10D 89/811 |
| 2023/0142014 A1* | 5/2023 | Kim | ....................... | H02H 9/045 |
| | | | | 257/79 |

FOREIGN PATENT DOCUMENTS

| | | | | |
|---|---|---|---|---|
| CN | 110164876 A | * | 8/2019 | ............. H10D 86/60 |
| TW | I342611 | | 5/2011 | |
| TW | 201944677 A | | 11/2019 | |
| TW | 202022438 A | | 6/2020 | |

* cited by examiner

*Primary Examiner* — Aaron J Gray
(74) *Attorney, Agent, or Firm* — Winston Hsu

(57) ABSTRACT

An electronic device includes a diode, a driving circuit, a first signal line, a second signal line, a first electrostatic protection circuit and a second electrostatic protection circuit. The diode has a first end and a second end. The first signal line is coupled between the first end and the driving circuit. The second signal line is coupled between the second end and the driving circuit. The first electrostatic protection circuit is coupled to the first signal line. The second electrostatic protection circuit is coupled to the second signal line.

20 Claims, 5 Drawing Sheets

FIG. 2

ELECTRONIC DEVICE WITH ELECTROSTATIC PROTECTION CIRCUITS CONNECTED TO DIODE AND DRIVING CIRCUITS

BACKGROUND OF THE DISCLOSURE

1. Field of the Disclosure

The present disclosure relates to an electronic device, and more particularly to an electronic device having electrostatic protection circuits.

2. Description of the Prior Art

Electrostatic discharge (ESD) often damages electronic devices and makes products unable to operate normally. The phenomenon of electrostatic discharge may also occur in the process of manufacturing or testing, which may lower the yield of electronic devices. Therefore, the industry is committed to improve the yield or reliability of electronic devices by reducing the damage caused by electrostatic discharge.

SUMMARY OF THE DISCLOSURE

An embodiment of the present disclosure provides an electronic device which includes a diode, a driving circuit, a first signal line, a second signal line, a first electrostatic protection circuit and a second electrostatic protection circuit. The diode includes a first end and a second end. The first signal line is coupled between the first end and the driving circuit. The second signal line is coupled between the second end and the driving circuit. The first electrostatic protection circuit is coupled to the first signal line. The second electrostatic protection circuit is coupled to the second signal line.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 2 is a schematic cross-sectional diagram illustrating the electronic device according to the first embodiment of the present disclosure.

DETAILED DESCRIPTION

Figure 1:
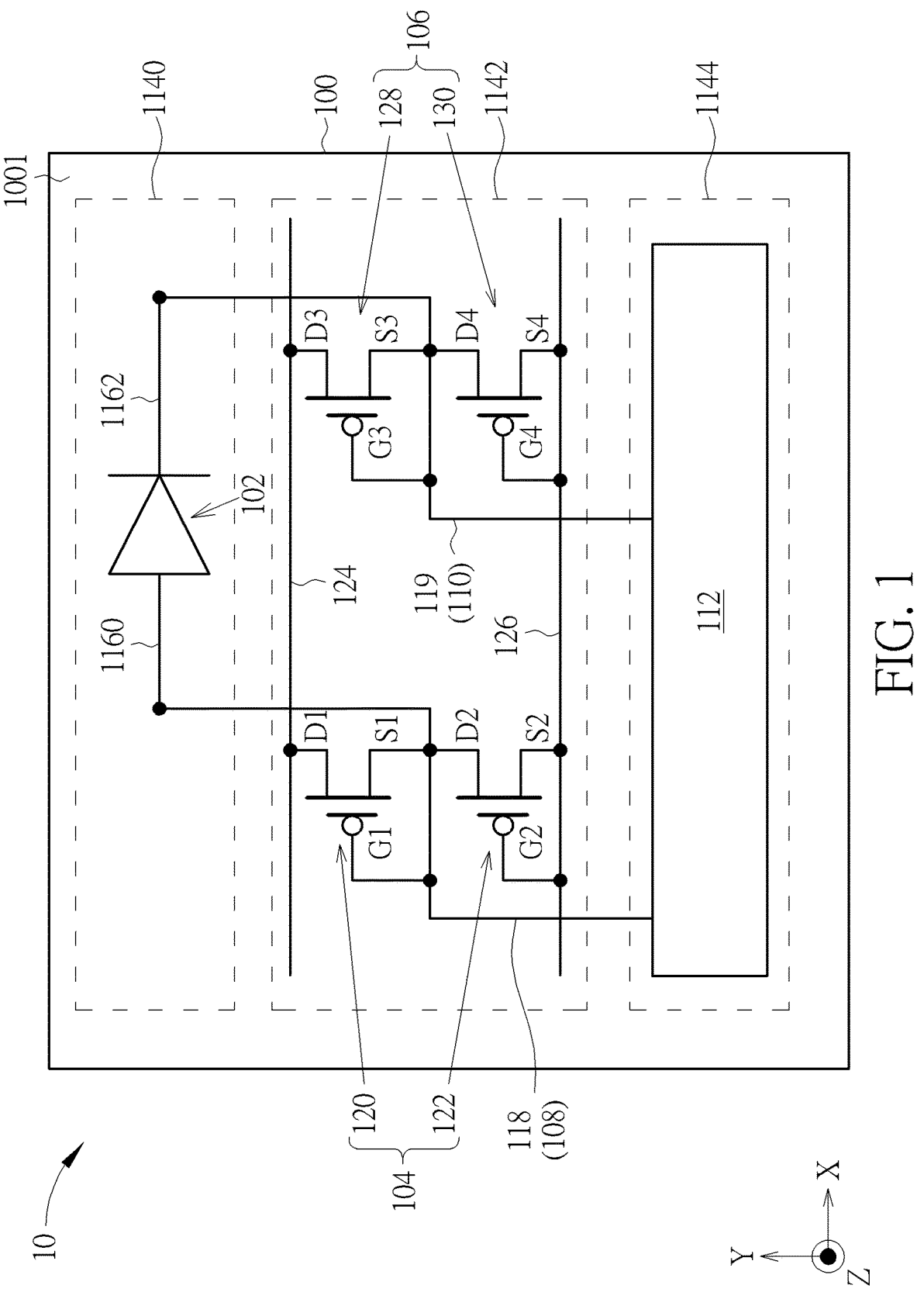
FIG. 1 is a schematic diagram illustrating an electronic device according to a first embodiment of the present disclosure.

The contents of the present disclosure will be described in detail with reference to specific embodiments and drawings. It is noted that, for purposes of illustrative clarity and being easily understood by the readers, the following drawings may be simplified schematic diagrams of electronic devices or a portion of the electronic devices, and components therein may not be drawn to scale. The numbers and dimensions of the components in the drawings are just illustrative, and are not intended to limit the scope of the present disclosure.

Certain terms are used throughout the specification and the appended claims of the present disclosure to refer to specific components. Those skilled in the art should understand that electronic equipment manufacturers may refer to a component by different names, and this disclosure does not intend to distinguish between components that differ in name but not function. In the following description and claims, the terms "comprise", "include" and "have" are used in an open-ended fashion, so they should be interpreted as "including but not limited to . . . ".

Directional terms such as "up", "down", "front", "rear", "left" and "right" used in the present disclosure are only directions with reference to the drawings. Therefore, the directional terms are used for illustration, and are not intended to limit the scope of the present disclosure. In the drawings, each drawing illustrates the general features of methods, structures and/or materials used in specific embodiments. However, these drawings should not be interpreted as defining or limiting the scope or characteristics of these embodiments. For example, the relative size, thickness and position of each layer, region and/or structure may be shrunk or enlarged for clarity.

It should be understood that when a component or layer is referred to as being "on" or "disposed on" another component or layer, or "connected to" another component or layer, it may be directly on the another component or layer or directly connected to the another component or layer, or there may be an interposed component or layer between the two components or layers (indirect case). Conversely, when a component is referred to as being "directly on" another component or layer, "directly disposed on" another component or layer, or "directly connected to" another component or layer, there are no interposed components or layers between the two components or layers. In addition, the arrangement relationship between different components may be explained by the content of the drawings.

Terms "equal" or "the same" usually mean within 20% of a given value, or within 10%, 5%, 3%, 2%, 1% or 0.5% of the given value.

An electrical connection may be a direct connection or an indirect connection. When two elements are electrically connected, the electrical signals may be transmitted by direct contact, and there are no other elements presented between the two elements. When two elements are electrically connected, the electrical signals may be transmitted through the intermediate element bridging the two elements. The electrical connection may also be referred to as coupling.

Terms "first", "second", "third", etc. may be used herein to describe various components, these components should not be limited by these terms. These terms may be used to distinguish different components in the specification. The same terms may not be used in the claims, and the components in the claims may be described by the terms "first", "second", "third", etc. according to the order of the components presented in the claims. Thus, a first component discussed below may be termed as a second component in the claims without departing from the present disclosure.

It should be understood that according to the following embodiments, features of different embodiments may be replaced, recombined or mixed to constitute other embodiments without departing from the spirit of the present disclosure.

The electronic device of the present disclosure may include a display device, a backlight device, an antenna device, a sensing device or a tiled device, but not limited thereto. The electronic devices may be bendable, flexible or rollable electronic devices. The display device may include a non-self-luminous display device or a self-luminous display device, but not limited thereto. The electronic device may include, for example, liquid crystal, light-emitting diodes (LED), fluorescence material, phosphor, quantum dots (QD), other suitable display medium, or a combination thereof, but not limited thereto. The antenna device may be a liquid crystal type antenna device or a non-liquid crystal type antenna device, and the sensing device may be a sensing device capable of sensing capacitance, light, thermal energy or ultrasonic waves, but not limited thereto.

The electronic device may include passive components and active components, such as capacitors, resistors, inductors, diodes, transistors, etc. The diode may include, for example, a light emitting diode or a photodiode, but not limited thereto. The light-emitting diode may include, for example, an organic light emitting diode (OLED), a mini light emitting diode (mini-LED), a micro light emitting diode (micro-LED) or quantum dots (QDs) light emitting diode (such as QLED, QDLED), but not limited thereto.

The tiled device may include, for example, a tiled display device or a tiled antenna device, but not limited thereto. It should be noted that the electronic device of the present disclosure may be any combination of the aforementioned devices, but not limited thereto. In addition, the appearance of the electronic device may be rectangular, circular, polygonal, a shape with curved edges, or other suitable shapes. The electronic device may have peripheral systems such as a driving system, a control system, a light source system, etc., to support a display device, an antenna device, a wearable device (such as an augmented reality or virtual reality device), a vehicle-mounted device (such as an automobile windshield) or a tiled device.

A direction X, a direction Y and a direction Z are shown in the following drawings. The direction Z may be a normal direction or a top view direction. As shown in FIG. 1, the direction Z may be perpendicular to a top surface 1001 of a substrate 100. The direction X and the direction Y may be horizontal directions and may be perpendicular to the direction Z. As shown in FIG. 1, the direction X and the direction Y may be parallel to the top surface 1001 of the substrate 100, and the direction X may be perpendicular to the direction Y. The spatial relationship of the structure may be explained according to the direction X, the direction Y and the direction Z in the following drawings.

Figure 2:
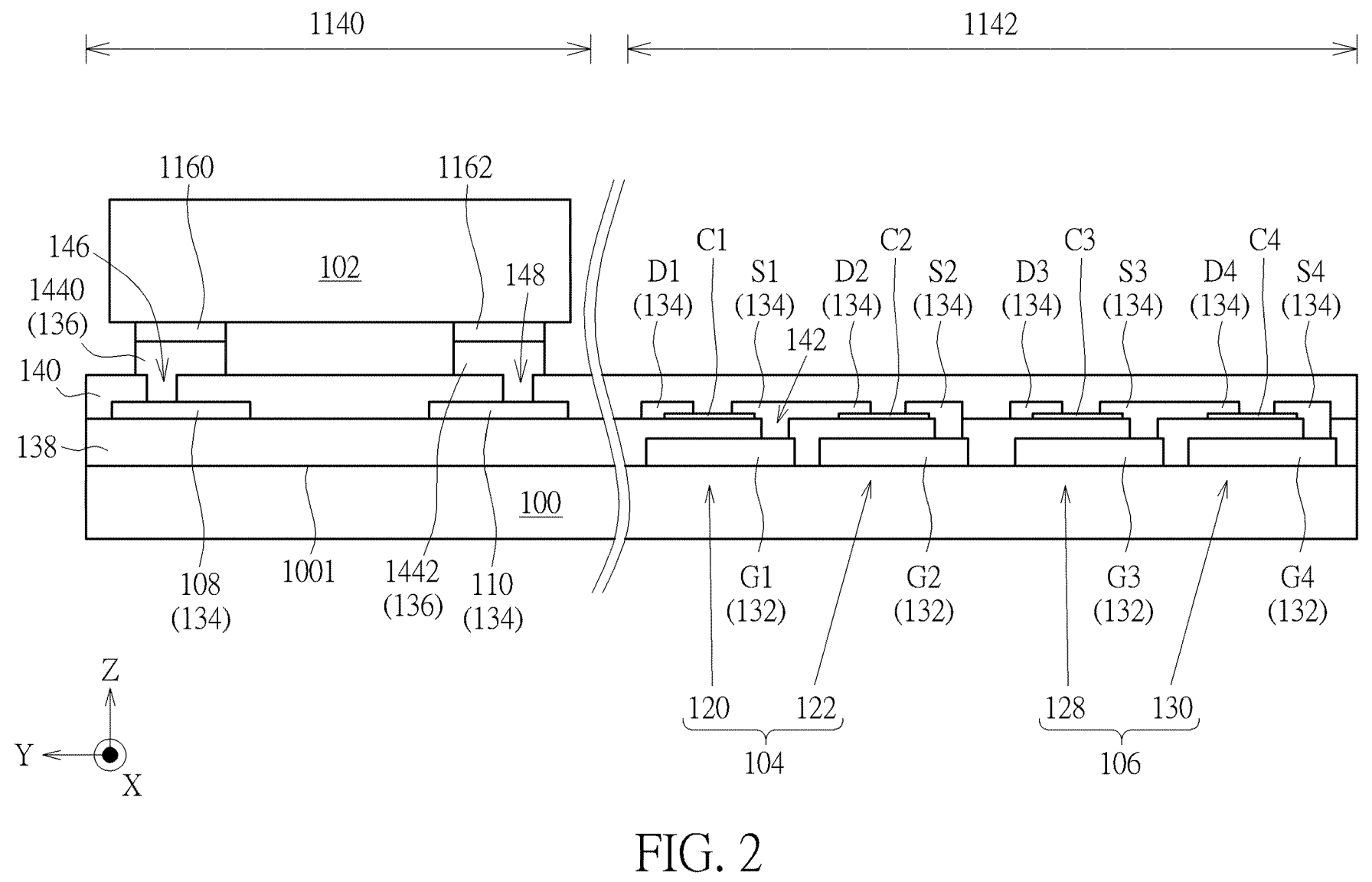

Please refer to FIG. 1 and FIG. 2, FIG. 1 is a schematic diagram illustrating an electronic device according to a first embodiment of the present disclosure, and FIG. 2 is a schematic cross-sectional diagram illustrating the electronic device according to the first embodiment of the present disclosure. As shown in FIG. 1, an electronic device 10 may include a substrate 100. The material of the substrate 100 may include glass, quartz, sapphire, polymer (such as polyimide (PI), polyethylene terephthalate (PET), etc.) and/or other suitable materials, and the material may be used as a flexible substrate or a rigid substrate, but not limited thereto. In addition, the shape of the substrate 100 in top view is not limited to rectangle, and the substrate 100 may have other suitable shapes.

The electronic device 10 may include a passive matrix (PM) display panel, but not limited thereto. For example, the electronic device 10 may include a plurality of diodes, a plurality of first electrostatic protection circuits, a plurality of second electrostatic protection circuits, a plurality of first signal lines, a plurality of second signal lines and a driving circuit, but not limited thereto. In FIG. 1 (and FIG. 3), one of the diodes 102, one of the electrostatic protection circuits 104 (or referred to as the first electrostatic protection circuit), one of the electrostatic protection circuits 106 (or referred to as the second electrostatic protection circuit), one of the signal lines 108 (or referred to as the first signal line), one of the signal lines 110 (or referred to as the second signal line) and a driving circuit 112 are shown as an example.

The diode 102, the electrostatic protection circuit 104, the electrostatic protection circuit 106, the signal line 108, the signal line 110 and the driving circuit 112 may be disposed on the substrate 100. In addition, the substrate 100 may include a region 1140 (or referred to as the first region), a region 1142 (or referred to as the second region) and a region 1144 (or referred to as the third region), but not limited thereto. The diodes (such as the diode 102) in the electronic device 10 may be disposed in the region 1140, the first electrostatic protection circuits and the second electrostatic protection circuits (such as the electrostatic protection circuit 104 and the electrostatic protection circuit 106) in the electronic device 10 may be disposed in the region 1142, and the driving circuit 112 may be disposed in the region 1144.

In some embodiments (as shown in FIG. 1), the region 1142 may be disposed between the region 1140 and the region 1144 in the direction Y, thus the electrostatic protection circuit 104 and the electrostatic protection circuit 106 may be disposed between the diode 102 and the driving circuit 112 in the direction Y, but not limited thereto. In some embodiments, the region 1140 may be, for example, a display region (or a functional region), and the region 1142 and the region 1144 may be, for example, a non-display region (or a non-functional region) and at least partially surround the display region (or the functional region), but the present disclosure is not limited thereto.

In some embodiments, the diode 102 may include a light emitting diode, and the light emitting diode may include an organic light emitting diode, a mini light emitting diode, a micro light emitting diode or a quantum dot light emitting diode, but not limited thereto. The diode 102 may include a first end 1160 and a second end 1162. The first end 1160 may be the anode of the diode 102 and correspond to the P-type region of the diode 102, and the second end 1162 may be the cathode of the diode 102 and correspond to the N-type region of the diode 102, but not limited thereto.

The driving circuit 112 may be directly disposed on the substrate 100 or may be bonded to the substrate 100 in the form of a chip, but not limited thereto. The signal line 108 may be coupled between the first end 1160 of the diode 102 and the driving circuit 112, and the signal line 110 may be coupled between the second end 1162 of the diode 102 and the driving circuit 112, and the driving circuit 112 can be electrically connected to the diode 102 and used for driving the diode 102.

In some embodiments (as shown in FIG. 1), the signal line 108 may include a connecting portion 118 (or referred to as the first connecting portion) disposed between the first end 1160 of the diode 102 and the driving circuit 112, and the signal line 110 may include a connecting portion 119 (or referred to as the second connecting portion) disposed between the second end 1162 of the diode 102 and the driving circuit 112, but not limited thereto.

The electrostatic protection circuit 104 may be coupled to the signal line 108, and in some embodiments (as shown in FIG. 1), the electrostatic protection circuit 104 may be coupled to the connecting portion 118 of the signal line 108, but not limited thereto. The electrostatic protection circuit 104 may include a transistor 120 (or referred to as the first transistor) and a transistor 122 (or referred to as the second transistor). The transistor 120 may include a gate G1 (or referred to as the first gate), a drain D1 (or referred to as the first drain) and a source S1 (or referred to as the first source). The gate G1 and the source S1 may be coupled to the connecting portion 118 of the signal line 108, and the gate G1 may be electrically connected to the source S1, thus the transistor 120 may be operated like a diode. In addition, the drain D1 may be coupled to a voltage signal line 124, and the voltage signal line 124 may be coupled to a low voltage source, and the drain D1 may be coupled to the low voltage source.

The transistor 122 may include a gate G2 (or referred to as the second gate), a drain D2 (or referred to as the second drain) and a source S2 (or referred to as the second source). The gate G2 and the source S2 may be coupled to a voltage signal line 126, and the voltage signal line 126 may be coupled to a high voltage source, and the gate G2 and the source S2 may be coupled to the high voltage source. The gate G2 may be electrically connected to the source S2, thus the transistor 122 may be operated like a diode. In addition, the drain D2 may be coupled to the connecting portion 118 of the signal line 108.

The electrostatic protection circuit 106 may be coupled to the signal line 110, and in some embodiments (as shown in FIG. 1), the electrostatic protection circuit 106 may be coupled to the connecting portion 119 of the signal line 110, but not limited thereto. The electrostatic protection circuit 106 may include a transistor 128 (or referred to as the third transistor) and a transistor 130 (or referred to as the fourth transistor). The transistor 128 may include a gate G3 (or referred to as the third gate), a drain D3 (or referred to as the third drain) and a source S3 (or referred to as the third source). The gate G3 and the source S3 may be coupled to the connecting portion 119 of the signal line 110, and the gate G3 may be electrically connected to the source S3, thus the transistor 128 may be operated like a diode. In addition, the drain D3 may be coupled to the voltage signal line 124, and the drain D3 may be coupled to the low voltage source.

The transistor 130 may include a gate G4 (or referred to as the fourth gate), a drain D4 (or referred to as the fourth drain) and a source S4 (or referred to as the fourth source). The gate G4 and the source S4 may be coupled to the voltage signal line 126, and the gate G4 and the source S4 may be coupled to the high voltage source. The gate G4 may be electrically connected to the source S4, thus the transistor 130 may be operated like a diode. In addition, the drain D4 may be coupled to the connecting portion 119 of the signal line 110.

As shown in FIG. 1, the transistor 120, the transistor 122, the transistor 128 and the transistor 130 may be P-type transistors. In the electrostatic protection circuit 104, the transistor 120 can be turned on when the static charge in the signal line 108 has a negative voltage (a voltage lower than the voltage provided by the low voltage source for example) and/or a large current, and the static charge can flow from the source S1 to the drain D1 of the transistor 120 and flow out through the voltage signal line 124 afterwards. The transistor 122 can be turned on when the static charge in the signal line 108 has a positive voltage (a voltage higher than the voltage provided by the high voltage source for example)

and/or a large current, and the static charge can flow from the drain D2 to the source S2 of the transistor 122 and flow out through the voltage signal line 126 afterwards. The electrostatic protection circuit 106 can also provide the same effects. Through the above mechanism, the electrostatic charge in the electronic device 10 can be removed, and the possibility of damaging circuits or components due to electrostatic discharge (ESD) can be reduced, thereby improving the yield or reliability of the electronic device 10.

As shown in FIG. 2, the electronic device 10 may include a metal layer 132 (or referred to as the first metal layer), a metal layer 134 (or referred to as the second metal layer), a metal layer 136, an insulating layer 138 and an insulating layer 140 disposed on the substrate 100, but not limited thereto. The metal layer 132 may include the gates of the transistors (such as the gate G1, the gate G2, the gate G3 and the gate G4), but not limited thereto. In addition, the insulating layer 138 may be disposed on the metal layer 132, and the insulating layer 138 may be disposed between metal layer 132 and the metal layer 134.

A semiconductor layer C1 (or referred to as the first semiconductor layer) of the transistor 120, a semiconductor layer C2 (or referred to as the second semiconductor layer) of the transistor 122, a semiconductor layer C3 (or referred to as the third semiconductor layer) of the transistor 128 and a semiconductor layer C4 (or referred to as the fourth semiconductor layer) of the transistor 130 may be disposed on the insulating layer 138. The semiconductor layer may include amorphous silicon, metal oxide or other suitable semiconductor materials, but not limited thereto.

The metal layer 134 may be disposed on the insulating layer 138, and the semiconductor layers (such as the semiconductor layer C1, the semiconductor layer C2, the semiconductor layer C3, and the semiconductor layer C4) of the transistors may be disposed between the metal layer 132 and the metal layer 134. The metal layer 134 may include the signal line 108, the signal line 110, and the sources (such as the source S1, the source S2, the source S3 and the source S4) and the drains (such as the drain D1, the drain D2, the drain D3 and the drain D4) of the transistors, but not limited thereto. Taking the transistor 120 as an example, the drain D1 may cover a portion of the semiconductor layer C1, and the source S1 may cover another portion of the semiconductor layer C1. The source S1 may be electrically connected to the gate G1 through a contact hole 142 penetrating through the insulating layer 138, and other transistors may have similar characteristics. In addition, the source S2 may be electrically connected to the gate G2 through another contact hole penetrating through the insulating layer 138.

The source S1 of the transistor 120 may be electrically connected to the drain D2 of the transistor 122, and the source S3 of the transistor 128 may be electrically connected to the drain D4 of the transistor 130, but not limited thereto. As shown in FIG. 2, the source S1 of the transistor 120 may be directly connected to the drain D2 of the transistor 122, and the source S3 of the transistor 128 may be directly connected to the drain D4 of the transistor 130, but not limited thereto. The drain D1 of the transistor 120 and the drain D3 of the transistor 128 may be coupled to the low voltage source through the voltage signal line 124 (shown in FIG. 1), and the source S2 of the transistor 122 and the source S4 of the transistor 130 may be coupled to the high voltage source through the voltage signal line 126 (shown in FIG. 1). The voltage signal line 124 and the voltage signal line 126 may be formed by the metal layer 134 or other suitable metal layers in the electronic device 10.

The insulating layer 140 may be disposed on the metal layer 134 and the semiconductor layers (such as the semiconductor layer C1, the semiconductor layer C2, the semiconductor layer C3 and the semiconductor layer C4) of the transistors. The metal layer 136 may be disposed on the insulating layer 140, and the metal layer 136 may include a connecting electrode 1440 and a connecting electrode 1442, but not limited thereto. The connecting electrode 1440 may be electrically connected to the signal line 108 through a contact hole 146 penetrating through the insulating layer 140, and the connecting electrode 1442 may be electrically connected to the signal line 110 through a contact hole 148 penetrating through the insulating layer 140. The first end 1160 (i.e., the anode) of the diode 102 may be bonded to the connecting electrode 1440, and the first end 1160 of the diode 102 may be electrically connected to the signal line 108. The second end 1162 (i.e., the cathode) of the diode 102 may be bonded to the connecting electrode 1442, and the second end 1162 of the diode 102 may be electrically connected to the signal line 110.

Please refer to the circuit architecture in FIG. 1, in some embodiments (such as FIG. 2), the signal line 108 in the region 1140 may be extended into the region 1142 and electrically connected to the source S1 of the transistor 120 and the drain D2 of the transistor 122, and the signal line 110 in the region 1140 may be extended into the region 1142 and electrically connected to the source S3 of the transistor 128 and the drain D4 of the transistor 130, but not limited thereto.

The material of the metal layer, the connecting electrode or the cathode and anode of the diode may include metal, alloy or the combination of the above, but not limited thereto. The material of the insulating layer may include inorganic insulating material, organic insulating material or a combination of the above, but not limited thereto. In some embodiments, the insulating layer may be a multilayer film.

The electronic devices of the present disclosure are not limited to the aforementioned embodiment. The following will continue to disclose other embodiments of the present disclosure. However, in order to simplify the description and highlight the differences between the embodiments, the same reference numerals are used to denote the same elements hereinafter, and the repeated portions will not be described again.

Figure 3:
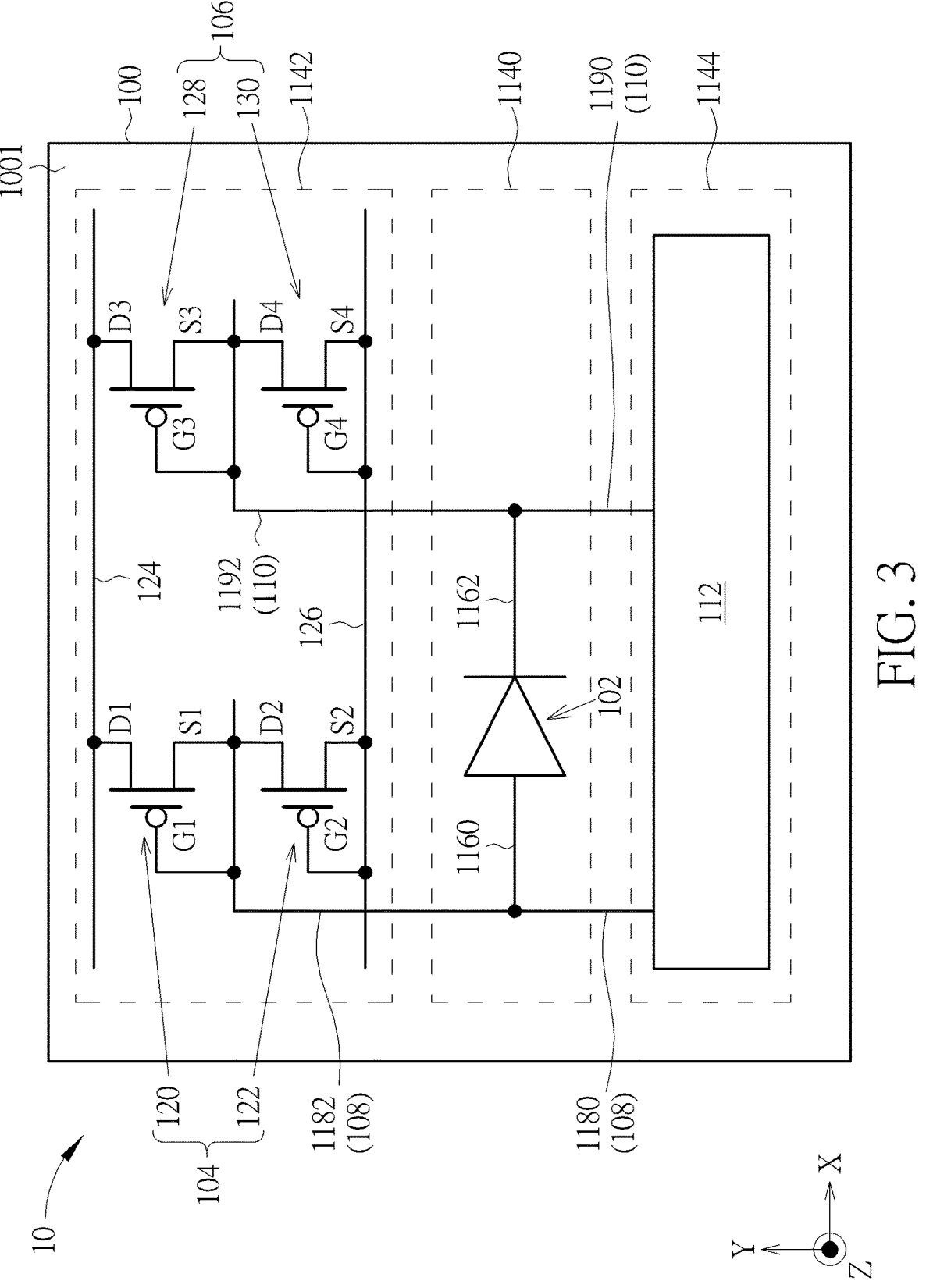
FIG. 3 is a schematic diagram illustrating an electronic device according to a second embodiment of the present disclosure.

Please refer to FIG. 3, FIG. 3 is a schematic diagram illustrating an electronic device according to a second embodiment of the present disclosure. In some embodiments (as shown in FIG. 3), the region 1140 may be disposed between the region 1142 and the region 1144 in the direction Y, and the diode 102 may be disposed between the electrostatic protection circuit 104 (and/or the electrostatic protection circuit 106) and the driving circuit 112 in the direction Y, but not limited thereto.

In addition, the signal line 108 may include a connecting portion 1180 (or referred to as the first connecting portion) disposed between the first end 1160 of the diode 102 and the driving circuit 112 and an extending portion 1182 (or referred to as the first extending portion) extending from the connecting portion 1180, and the electrostatic protection circuit 104 may be coupled to (or connected to) the extending portion 1182, but not limited thereto. The signal line 110 may include a connecting portion 1190 (or referred to as the second connecting portion) disposed between the second end 1162 of the diode 102 and the driving circuit 112 and an extending portion 1192 (or referred to as the second extending portion) extending from the connecting portion 1190, and the electrostatic protection circuit 106 may be coupled to (or connected to) the extending portion 1192, but not limited thereto. In other embodiments, the extended portion may be, for example, a portion of the signal line that is not disposed between the first end and the driving circuit and extends from the connecting portion.

In some embodiments, the region 1142 of the substrate 100 and the electrostatic protection circuit 104 and the electrostatic protection circuit 106 in the region 1142 may be removed to reduce the volume of the electronic device 10 after the electronic device 10 is manufactured. The electrostatic protection circuit 104 and the electrostatic protection circuit 106 may provide the function of reducing ESD phenomenon during the manufacturing process of the electronic device 10, but not limited thereto. In some embodiments, the region 1142 of the substrate 100 and the electrostatic protection circuit 104 and the electrostatic protection circuit 106 in the region 1142 may still remain in the electronic device 10 after the electronic device 10 is manufactured. The electrostatic protection circuit 104 and the electrostatic protection circuit 106 may provide the function of reducing ESD phenomenon when the electronic device 10 is operating, but not limited thereto.

Except for the differences between the second embodiment and the first embodiment described above, other features of the second embodiment may be the same as or similar to those of the first embodiment, and may achieve the same effects as those described in the first embodiment, which will not be repeated here.

Figure 4:
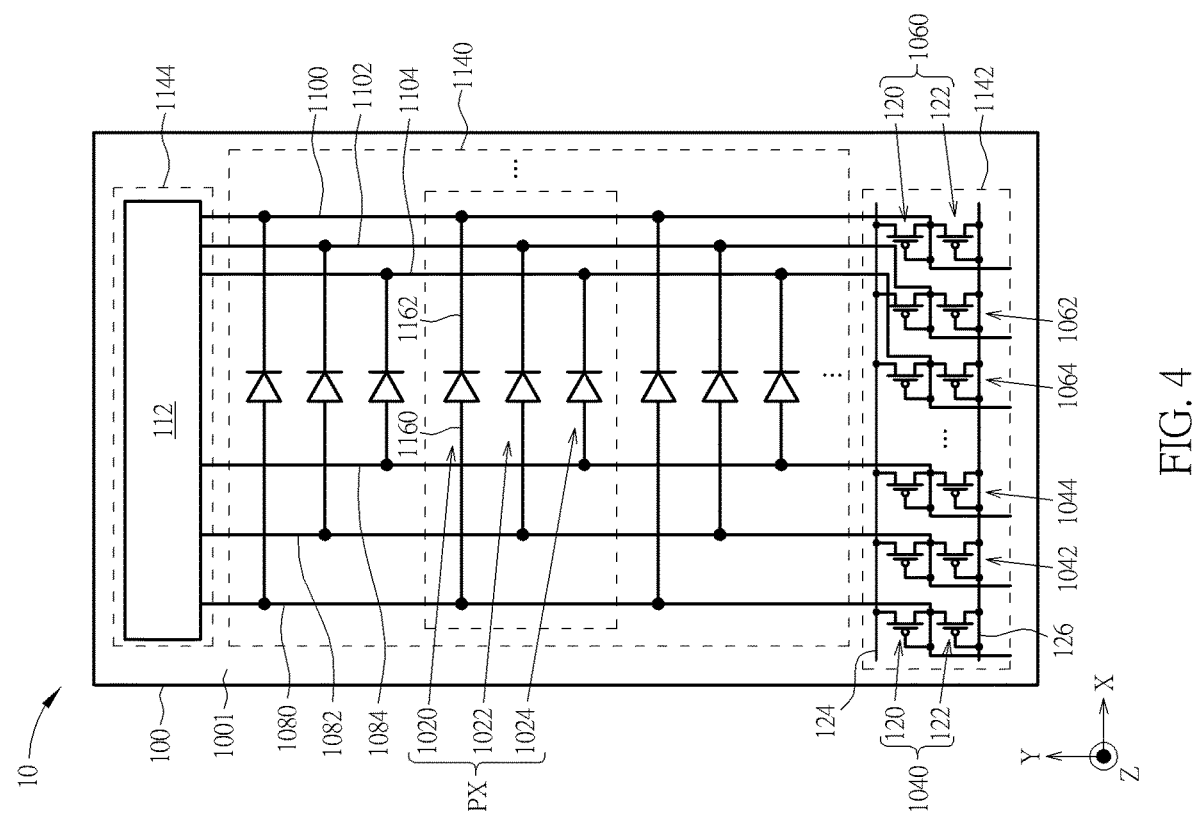
FIG. 4 is a schematic diagram illustrating an electronic device according to a third embodiment of the present disclosure.

Please refer to FIG. 4, FIG. 4 is a schematic diagram illustrating an electronic device according to a third embodiment of the present disclosure. In some embodiments, the diodes in the electronic device 10 may be arranged in a plurality of diode columns, each of the diode columns may extend along the direction Y and the diode columns may be arranged side by side along the direction X to form a diode array, but the arrangement of the diodes is not limited to this, and one of the diode columns is shown in FIG. 4 as an example.

One of the diode columns may include a plurality of pixels arranged along the direction Y, and therefore the diode column may also be regarded as a pixel column. Taking one pixel PX as an example, the pixel PX may include a diode 1020, a diode 1022 and a diode 1024, but not limited thereto. The diode 1020 may be corresponded to a red sub-pixel, the diode 1022 may be corresponded to a green sub-pixel, and the diode 1024 may be corresponded to a blue sub-pixel, but not limited thereto. In addition, the pixel column may be formed of the repeatedly arranged pixels PX, but not limited thereto.

The first ends 1160 of the diodes 1020 in the pixels PX in the same pixel column may be coupled to a signal line 1080, the first ends 1160 of the diodes 1022 in the pixels PX in the same pixel column may be coupled to a signal line 1082, and the first ends 1160 of the diodes 1024 in the pixels PX in the same pixel column may be coupled to a signal line 1084, but not limited thereto.

In addition, an electrostatic protection circuit 1040 may be coupled to the signal line 1080, an electrostatic protection circuit 1042 may be coupled to the signal line 1082, and an electrostatic protection circuit 1044 may be coupled to the signal line 1084. The electrostatic protection circuit 1040, the electrostatic protection circuit 1042, the electrostatic protection circuit 1044 and other electrostatic protection circuits may be arranged along the direction X, but not limited thereto.

On the other hand, the second ends 1162 of the diodes 1020 in the pixels PX in the same pixel column may be coupled to a signal line 1100, the second ends 1162 of the diodes 1022 in the pixels PX in the same pixel column may be coupled to a signal line 1102, and the second ends 1162 of the diodes 1024 in the pixels PX in the same pixel column may be coupled to a signal line 1104, but not limited thereto.

In addition, an electrostatic protection circuit 1060 may be coupled to the signal line 1100, an electrostatic protection circuit 1062 may be coupled to the signal line 1102, and an electrostatic protection circuit 1064 may be coupled to the signal line 1104. The electrostatic protection circuit 1060, the electrostatic protection circuit 1062, the electrostatic protection circuit 1064 and other electrostatic protection circuits may be arranged along the direction X, but not limited thereto.

In some embodiments (as shown in FIG. 4), the region 1140 may be disposed between the region 1142 and the region 1144 in the direction Y, and therefore the diodes may be disposed between the electrostatic protection circuits and the driving circuit 112 in the direction Y, but not limited thereto. In some embodiments, the region 1142 of the substrate 100 and the electrostatic protection circuits in the region 1142 may be removed to reduce the volume of the electronic device 10 after the electronic device 10 is manufactured, but not limited thereto. In some embodiments, the region 1142 of the substrate 100 and the electrostatic protection circuits in the region 1142 may still remain in the electronic device 10 after the electronic device 10 is manufactured, but not limited thereto.

Except for the technical features of the third embodiment described above, the remaining features of the third embodiment may be the same as or similar to those of the first embodiment and/or the second embodiment, and may achieve the same effects as the above-mentioned embodiments, which will not be repeated here.

Figure 5:
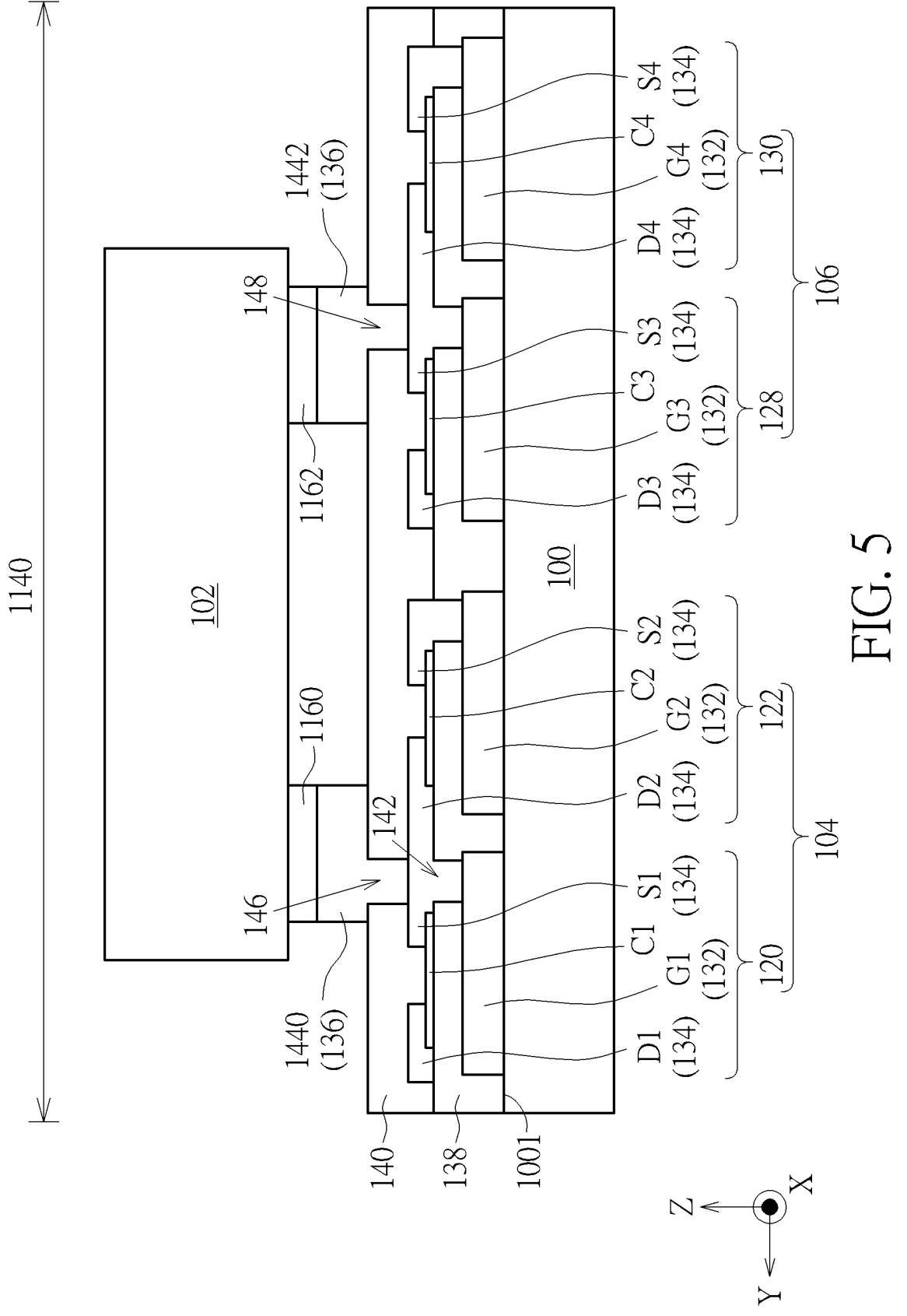
FIG. 5 is a schematic cross-sectional diagram illustrating the electronic device according to a fourth embodiment of the present disclosure.

Please refer to FIG. 5, FIG. 5 is a schematic cross-sectional diagram illustrating the electronic device according to a fourth embodiment of the present disclosure. Different from the first embodiment (as shown in FIG. 2), the transistor 120 and the transistor 122 of the electrostatic protection circuit 104 and the transistor 128 and the transistor 130 of the electrostatic protection circuit 106 in some embodiments (as shown in FIG. 5) may be disposed under the diode 102 in the direction Z, but not limited thereto. The connecting electrode 1440 of the diode 102 may be electrically connected to the source S1 of the transistor 120 and the drain D2 of the transistor 122 through the contact hole 146, and the connecting electrode 1442 of the diode 102 may be electrically connected to the source S3 of the transistor 128 and the drain D4 of the transistor 130 through the contact hole 148.

Please refer to the circuit architecture in FIG. 1, in some embodiments (such as FIG. 5), the source S1 of the transistor 120 and the drain D2 of the transistor 122 may be electrically connected to the signal line 108 and coupled to the driving circuit 112 through the signal line 108, and the source S3 of the transistor 128 and the drain D4 of the transistor 130 may be electrically connected to the signal line 110 and coupled to the driving circuit 112 through the signal line 110.

Therefore, in some embodiments, the electrostatic protection circuit 104 and the electrostatic protection circuit 106 may be disposed in the region 1140 with the diode 102, and the volume of the electronic device 10 may be reduced. Except for the difference between the fourth embodiment and the first embodiment described above, other features of the fourth embodiment may be the same as or similar to those of the first embodiment and/or the second embodiment, and may achieve the same effects as the above embodiments, which will not be repeated here.

In summary, the electronic device of the present disclosure includes the first electrostatic protection circuit and the second electrostatic protection circuit. The first electrostatic protection circuit and the second electrostatic protection circuit are coupled to the first signal line and the second signal line, and the first signal line and the second signal line are coupled between the diode and the driving circuit. The electrostatic charge in the electronic device can be removed through the first electrostatic protection circuit and the second electrostatic protection circuit, and the possibility of damaging circuits or components due to electrostatic discharge (ESD) can be reduced, thereby improving the yield or reliability of the electronic device. In some embodiments, the electrostatic protection circuits can be removed to reduce the volume of the electronic device after the electronic device is manufactured. In some embodiments, the electrostatic protection circuits can still remain in the electronic device after the electronic device is manufactured, and the electrostatic protection circuits can provide the function of reducing ESD phenomenon when the electronic device is operating.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a diode comprising a first end and a second end;
   a driving circuit;
   a first signal line coupled between the first end and the driving circuit;
   a second signal line coupled between the second end and the driving circuit;
   a first electrostatic protection circuit coupled to the first signal line; and
   a second electrostatic protection circuit coupled to the second signal line, wherein the first electrostatic protection circuit comprises:
      a first transistor comprising a first semiconductor layer, a first gate, a first drain and a first source, wherein the first gate and the first source are coupled to the first signal line, and the first drain is coupled to a low voltage source; and
      a second transistor comprising a second semiconductor layer, a second gate, a second drain and a second source, wherein the second gate and the second source are coupled to a high voltage source, and the second drain is coupled to the first signal line.

2. The electronic device according to claim 1, wherein the first signal line comprises a first connecting portion disposed between the first end and the driving circuit, and the first electrostatic protection circuit is coupled to the first connecting portion.

3. The electronic device according to claim 1, wherein the first signal line comprises a first connecting portion disposed between the first end and the driving circuit and a first extending portion extending from the first connecting portion, and the first electrostatic protection circuit is coupled to the first extending portion.

4. The electronic device according to claim 1, wherein the second signal line comprises a second connecting portion disposed between the second end and the driving circuit, and the second electrostatic protection circuit is coupled to the second connecting portion.

5. The electronic device according to claim 1, wherein the second signal line comprises a second connecting portion disposed between the second end and the driving circuit and a second extending portion extending from the second connecting portion, and the second electrostatic protection circuit is coupled to the second extending portion.

6. The electronic device according to claim 1, further comprising:
   a first metal layer comprising the first gate and the second gate; and
   a second metal layer disposed on the first metal layer, wherein the second metal layer comprises the first drain, the first source, the second drain and the second source.

7. The electronic device according to claim 6, wherein the first source of the first transistor is directly connected to the second drain of the second transistor.

8. The electronic device according to claim 6, further comprising an insulating layer disposed between the first metal layer and the second metal layer, wherein the first source of the first transistor is electrically connected to the first gate of the first transistor through a contact hole penetrating through the insulating layer.

9. The electronic device according to claim 6, further comprising an insulating layer disposed between the first metal layer and the second metal layer, wherein the second source of the second transistor is electrically connected to the second gate of the second transistor through a contact hole penetrating through the insulating layer.

10. The electronic device according to claim 6, wherein the second metal layer comprises the first signal line, and the electronic device further comprises:
   an insulating layer disposed on the second metal layer; and
   a connecting electrode disposed on the insulating layer, wherein the connecting electrode is electrically connected to the first signal line through a contact hole penetrating through the insulating layer, and the first end of the diode is bonded to the connecting electrode.

11. The electronic device according to claim 6, wherein the second metal layer comprises the second signal line, and the electronic device further comprises:
   an insulating layer disposed on the second metal layer; and
   a connecting electrode disposed on the insulating layer, wherein the connecting electrode is electrically connected to the second signal line through a contact hole penetrating through the insulating layer, and the second end of the diode is bonded to the connecting electrode.

12. The electronic device according to claim 6, wherein the first transistor and the second transistor of the first electrostatic protection circuit are disposed under the diode.

13. The electronic device according to claim 12, further comprising:
   an insulating layer disposed on the second metal layer; and
   a connecting electrode disposed on the insulating layer, wherein the connecting electrode is electrically connected to the first source of the first transistor and the second drain of the second transistor through a contact hole penetrating through the insulating layer, and the first end of the diode is bonded to the connecting electrode.

14. The electronic device according to claim 6, wherein the first semiconductor layer and the second semiconductor layer are disposed between the first metal layer and the second metal layer.

15. The electronic device according to claim 1, wherein the first transistor and the second transistor are P-type transistors.

16. The electronic device according to claim 1, wherein the second electrostatic protection circuit comprises:
   a third transistor comprising a third semiconductor layer, a third gate, a third drain and a third source, wherein the third gate and the third source are coupled to the second signal line, and the third drain is coupled to the low voltage source; and
   a fourth transistor comprising a fourth semiconductor layer, a fourth gate, a fourth drain and a fourth source, wherein the fourth gate and the fourth source are coupled to the high voltage source, and the fourth drain is coupled to the second signal line.

17. The electronic device according to claim 16, further comprising:
   a first metal layer comprising the third gate and the fourth gate;
   a second metal layer disposed on the first metal layer, wherein the second metal layer comprises the third drain, the third source, the fourth drain and the fourth source;
   an insulating layer disposed on the second metal layer; and
   a connecting electrode disposed on the insulating layer, wherein the connecting electrode is electrically connected to the third source of the third transistor and the fourth drain of the fourth transistor through a contact hole penetrating through the insulating layer, and the second end of the diode is bonded to the connecting electrode.

18. The electronic device according to claim 1, further comprising a substrate, wherein the diode, the driving circuit, the first electrostatic protection circuit and the second electrostatic protection circuit are disposed on the substrate, and the substrate comprises:
   a first region, wherein the diode is disposed in the first region;
   a second region, wherein the first electrostatic protection circuit and the second electrostatic protection circuit are disposed in the second region; and
   a third region, wherein the driving circuit is disposed in the third region,
   wherein the second region is disposed between the first region and the third region, or the first region is disposed between the second region and the third region.

19. The electronic device according to claim 1, wherein the diode comprises an organic light emitting diode, a mini light emitting diode, a micro light emitting diode or a quantum dot light emitting diode.

20. An electronic device, comprising:
   a diode comprising a first end and a second end;
   a driving circuit;
   a first signal line coupled between the first end and the driving circuit;
   a second signal line coupled between the second end and the driving circuit;
   a first electrostatic protection circuit coupled to the first signal line; and a second electrostatic protection circuit coupled to the second signal line, wherein the second electrostatic protection circuit comprises:

a third transistor comprising a third semiconductor layer, a third gate, a third drain and a third source, wherein the third gate and the third source are coupled to the second signal line, and the third drain is coupled to a low voltage source; and a fourth transistor comprising a fourth semiconductor layer, a fourth gate, a fourth drain and a fourth source, wherein the fourth gate and the fourth source are coupled to a high voltage source, and the fourth drain is coupled to the second signal line.

* * * * *